United States Patent [19]

Shurtz, II et al.

[11] Patent Number: 5,063,418

[45] Date of Patent: Nov. 5, 1991

[54] OPTICAL NON-LINEAR ARTIFICIAL DIELECTRICS

[75] Inventors: Richard R. Shurtz, II, Oakton; Edward J. Sharp, Fredericksburg; James E. Miller, Woodbridge, all of Va.

[73] Assignee: The United States of America as represented by the Secretary of the Army, Washington, D.C.

[21] Appl. No.: 430,685

[22] Filed: Oct. 31, 1989

[51] Int. Cl.$^5$ ............... H01L 29/48; H01L 39/22; G02B 5/23; G02F 1/01
[52] U.S. Cl. ............... 357/15; 357/3; 357/5; 359/241
[58] Field of Search ............... 357/3, 5, 12, 13, 15; 350/354, 339 R, 333, 334; 307/311

[56] References Cited

U.S. PATENT DOCUMENTS

| | | | |
|---|---|---|---|
| 4,607,272 | 8/1986 | Osbourn | 357/4 SL |
| 4,863,245 | 9/1989 | Roxlo | 357/16 |
| 4,983,022 | 1/1991 | Shannon | 350/339 R |

Primary Examiner—Andrew J. James
Assistant Examiner—Daniel N. Russell
Attorney, Agent, or Firm—Milton W. Lee; Anthony T. Lane

[57] ABSTRACT

Non-linear optical materials, i.e., those optical materials whose indices of refraction depend on input radiation intensity, are few and of low non-linearities; this invention uses various metallic patterns on a transparent substrate, with non-linear elements between parts of the patterns, to function as an artificial dielectric. These elements may take the form of metal-oxide-metal tunnel diodes, Schottky diodes, p-n junction diodes, superlattice structures, and non-linear capacitors.

26 Claims, 5 Drawing Sheets

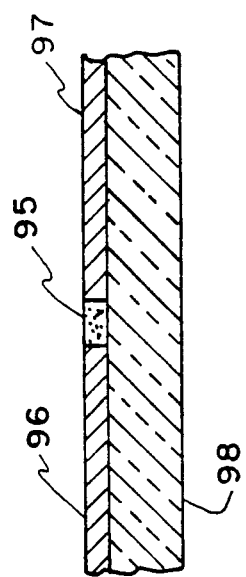
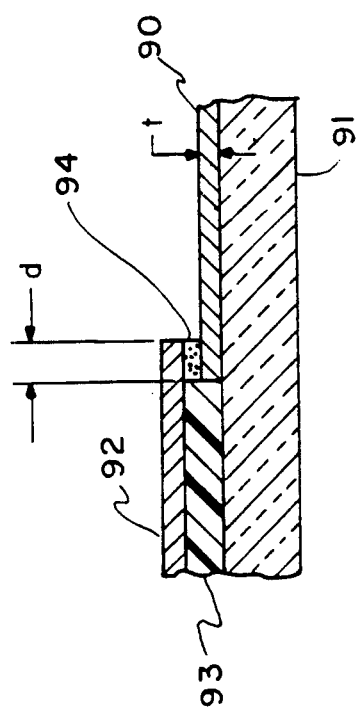

OPTICAL NON-LINEAR ARTIFICIAL DIELECTRICS

The invention described herein may be manufactured, used, and licensed by the U.S. Government for governmental purposes without the payment of any royalties thereon.

This application is related to application Ser. No. 545234 filed concurrently by the same applicant.

BACKGROUND OF INVENTION

This invention is in the field of optical materials, and in particular is concerned with artificially created non-linear electro-optic materials which are suitable for use over a wide range of wavelengths from the visible well into the mm-wave regions. By definition, a non-linear material exhibits optical properties which depend upon the intensity of the input radiation. This typically means that the optical index of refraction, seen by an electromagnetic wave propagating through the material, depends upon the magnitude of the electric field vector. This effect is sometimes described by the non-linear relationship between the induced optical polarization and the input electric field vector. The number of optical materials which exhibit a high degree of non-linearity is limited. In fact, in some regions of the spectrum, such as the 8–12 μm region, optically active transparent materials are rare. Nonlinear optical materials may be used for an extensive array of applications. For example, they may be used to generate harmonics of an input field frequency. This is a very convenient method of generating a coherent spectral output in wavelength regions where laser lines are scarce. Such materials can also be used to generate sum and difference frequencies of two input lasers or to mix the output lines of three or more lasers. A major application of four-wave mixing, for example, is the generation of a phase-conjugate reflected signal to cancel the effects of beam distortion, whether caused within a laser cavity or by atmospheric or optical effects outside of the cavity. If the index of refraction increases with field intensity, the non-linear material self-focusses; if it decreases with intensity, it self-defocusses. Both of these effects can be used in conjunction with external optics to generate an optical bistability for high-speed, optically-driven switching. Unfortunately, most materials which are transparent to a given wavelength of radiation do not exhibit large non-linearities, and high field intensities are required to produce a usable effect. These intensities are typically of the same order of magnitude as the optical damage threshold of the materials, making for an inherent reliability problem. Moreover, there are no known bulk non-linear materials in the millimeter wave region. In view of the above, we set out to develop techniques, and ultimately media which possess artifically-generated non-linear optical properties. We call such media non-linear artificial dielectrics, and they are described herebelow.

SUMMARY OF THE INVENTION

The invention is a non-linear artificial dielectric, in several embodiments. In general, the dielectric consists of a planar substrate, transparent to radiation at a wavelength or waveband of interest and with a thin metallic (i.e., highly conductive or superconductive) mesh or array on the substrate, and with non-linear elements in the mesh or array. The feature size and spacing of the mesh or array must be small compared to the input wavelength to avoid diffractive effects.

BRIEF DESCRIPTION OF THE DRAWINGS

FIGS. 7a and 7b are side sectional view of two non-linear capacitor configurations which may be incorporated into either or both of the FIG. 1 and FIG. 2 meshes.

DESCRIPTION OF PREFERRED EMBODIMENTS

Figure 1A:
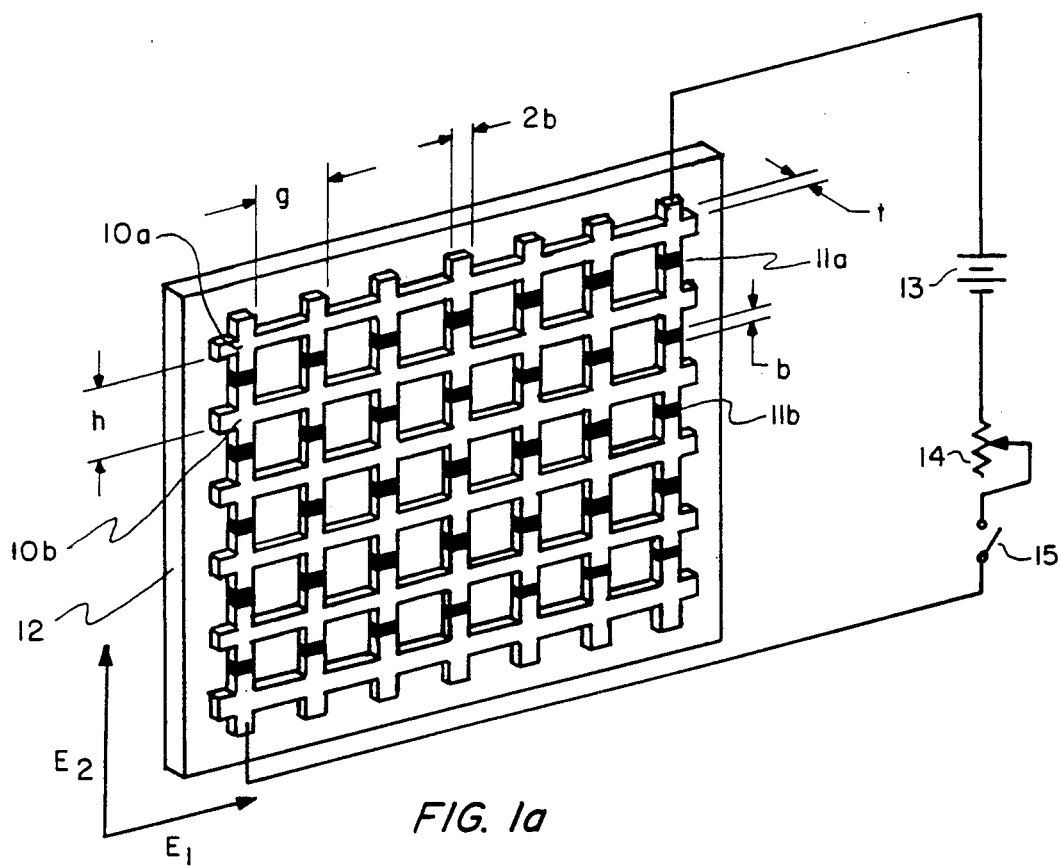
FIGS. 1a and 1b show embodiments of the invention in the forms of inductive meshes.
Figure 1B:
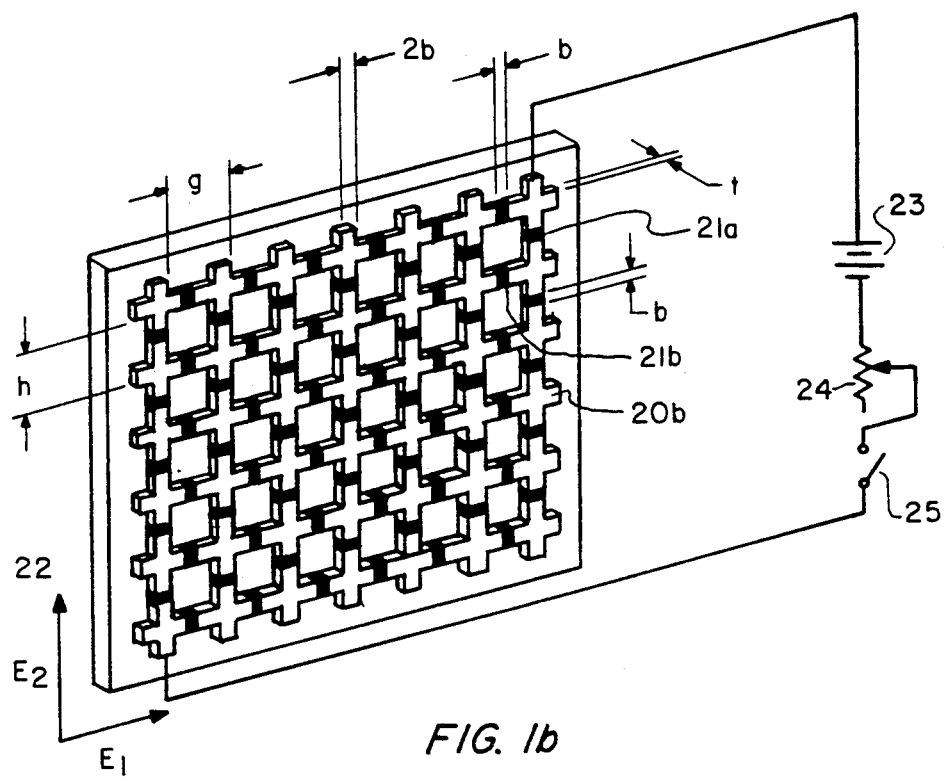
Figure 2A:
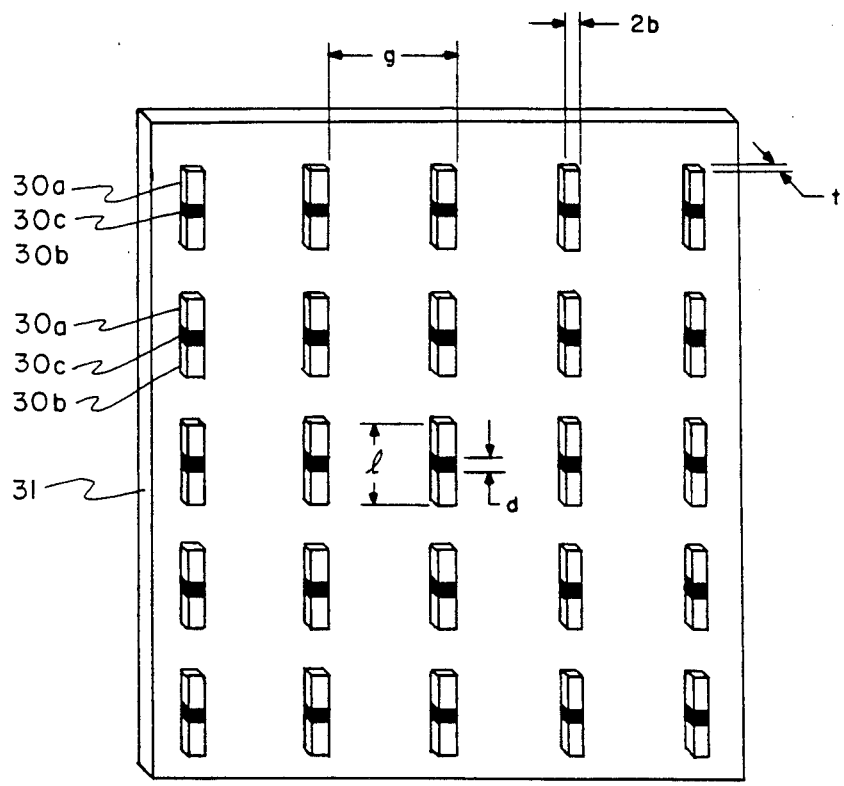
FIGS. 2a and 2b show embodiments of the invention in the forms of capacitive meshes.
Figure 2B:
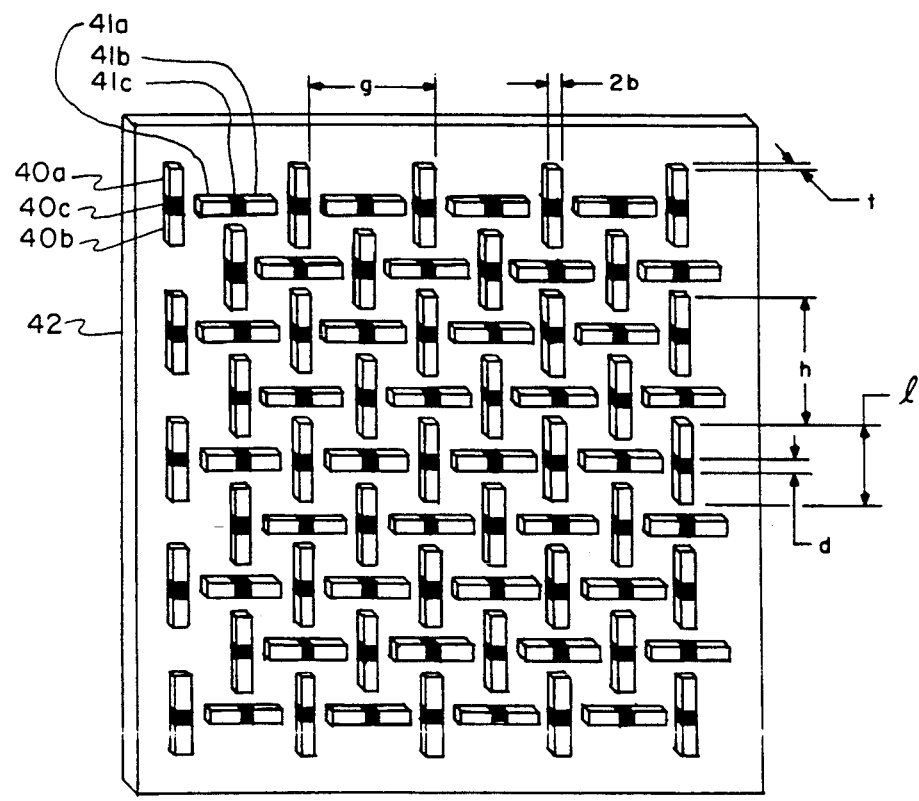

The general properties of non-linear meshes can be conveniently described using circuit theory. The incoming radiation creates an electro-magnetic aperture field distribution within the open areas of the mesh, which satisfies the appropriate boundary conditions. These aperture fields induce both conductive currents around each of the rectangular apertures, corresponding to an inductance, as well as displacement currents across the gaps, corresponding to a capacitance. The meshes in FIGS. 1a and 1b are contiguous and are called inductive because of the large inductance created by the rectangular openings in the mesh. The meshes in FIGS. 2a and 2b are called capacitive because current flow through their non-contiguous structure is primarily displacive across the inter-element capacitance. The equivalent circuit parameters can be derived by using transmission line theory or scattering theory.

The artificial dielectrics of this invention can be described in terms of an equivalent circuit for capacitive and conductive meshes. In one simple form, we have a two dimensional regular array of Greek crosses formed with non-linear elements between the arms of the crosses. More general mesh structures can, of course, be used where dipoles, tripoles, rectangles, etc can be used to make up the metallic pattern. These meshes and arrays are not confined to two dimensions. Three dimensional structures can be formed by stacking the meshes or by imbedding a 3-D metallic array in a bulk transmissive medium. The collective interaction of the arrayed conductive unit cells alters the phase of the transmitted and reflected plane waves, in a way which depends upon the intensity of the input radiation. In this invention disclosure, non-linear devices are incorporated into these circuits, as non-linear capacitive, resistive or inductive elements. This concept differs from conventional non-linear materials in that the non-linear interaction occurs through the field induced current rather than through the optical field itself. This difference is important, for the resistive and capacitive non-linearities, because it permits the concentration of optical energy in volumes which are smaller than those permitted with conventional free space optics. This new found design freedom allows the use of smaller non-linearities. In this case, the limits of performance are not dictated by the ratio of input aperture to point spread function, but rather by the antenna cross-section to non-linear device area ratio. The lower limit of this device area is fundamentally limited by quantum effects and practically limited by fabrication yield.

The non-linearity of the imbedded devices produces a non-linear relationship between the optical voltage and the circuit current. This differs from a real dielectric where the non-linear relationship is between the electric field and the induced polarization. If the optically active devices possess asymmetric electrical properties, the mesh will exhibit an odd-order optical non-linearity, with third order effects dominating. If the optically active devices are symmetric, the overall mesh will exhibit an even-order optical non-linearity, with second order effects dominating, just as any centro-symmetric non-linear material.

Resistive non-linear devices include: Josephson junctions, Schottky and PN junction diodes, Gunn diodes, tunnel diodes, MOM diodes, and superlattice non-linear structures including modulation doped materials and quantum well arrays. The applicability of these devices within any particular wavelength range is determined by the ratio of non-linearity to loss. Superconductive junctions and MOM tunnel diodes are thought to be more applicable in the short wavelength range, while the other more conventional diode structures will be useful in the longer wavelength (lower frequency) regions. Capacitive non-linear devices include capacitive structures which use conventional non-linear optical materials for the dielectric medium. Such materials may include SBN, $BaTiO_3$, ADP, KDP, etc. Inductive non-linear devices include the use of ferrofluids, ferrofluid composites, and Faraday rotators.

In order to appear non-linear to the input radiation, the imbedded non-linear devices must respond at the optical frequency of the input radiation. This is a severe requirement, particularly in the short-wavelength optical region. For non-linear resistive tuning, a non-symmetric diode behavior is given by asymmetric metal-oxide-metal tunnel diodes in the optical regime and by Schottky and p-n junction diodes in the millimeter wave region; a symmetric diode behavior is given by symmetric MOM devices in the high frequency domain and by bulk charge transfer, in k-space via the Gunn effect or in real-space superlattice layers, in the millimeter wave region. For reactive tuning, the imbedded capacitors would be formed with optically non-linear dielectric layers, such as strontium barium niobate, lithium niobate or lithium tantalate.

Except for the Gunn diode, the superlattice, and the non-linear capacitor, the behavior of these structures differs significantly from that of conventional dielectrics in that the strength of the non-linearity is independent of the input field strength since it arises from the inherent diode non-linearity. Thus, the conversion efficiency is independent of the input field strength, making these structures useful for low intensity applications. Furthermore, if these diodes are incorporated into an inductive mesh, where they are electrically connected to the edge, it is possible to bias them to a voltage where their non-linearity is maximized and thus increase the non-linear susceptability of the structure.

The inventive meshes can be fabricated with either superconductive conductors (with proper cooling), or with conventional conductors. Superconductive meshes are useful since they reduce the lead resistance of ultra-small non-linear devices. Such ultra-small devices may be used to enhance the power concentration of the structure.

All mesh structures would be designed to operate in the zeroth order diffractive mode. This will assure that energy will not be diffracted out of the main beam, but rather will only be delayed by the intrinsic circuit reactance.

Looking now at the structure of FIG. 1a, we see a mesh consisting of parallel strips 10a, 10b, etc. each strip being in the form of rows of crosses, with horizontal arms of the crosses joined. The crosses are each of a width g except for the end cross of each row and the strips are spaced apart a distance b equal to the length of non-linear elements 11a, 11b, etc. The strips are formed of a highly conductive metal, such as gold, and have thicknesses t on transparent substrate 12. This structure acts as a non-isotropic artificial dielectric.

Referring now to FIG. 1b, we see a mesh structure consisting of a regular array of Greek crosses 20a, 20b, etc. with non-linear elements 21a, 21b, etc. between the crosses. The spacing between corresponding points on the crosses is g (horizontally) and h (vertically). The width of the non-linear elements is b. These dimensions b, g, and h, and thickness t of the highly conductive crosses corresponds to those same dimensions in FIG. 1a. The array of crosses in FIG. 1b is on transparent substrate 22. In both FIGS. 1a and 1b, the thicknesses of the substrates are not critical, since they are transparent to wavelengths with which these artificial dielectrics are used.

For the meshes just described, the aperture modes of oscillation corresponding to the two indicated orientations of the transverse electric field, E1 and E2, are orthogonal and thus independent. In other words, two input polarizations can excite two independent equivalent circuits. If these circuits differ, either because of the device placement or the mesh geometry, the structure is birefringent and the non-linearity is non-isotropic, such as FIG. 1a. If the circuits are the same, as they would be with h and g equal and device placement symmetric (as in FIG. 1b), the non-linearity would be isotropic. If g and h are unequal but device placement is symmetric the non-linearity would be non-isotropic. The FIGS. 1a and 1b meshes may be considered inductive because of the large inductance created by the rectangular openings in the mesh. Although these meshes will operate without any voltage biases applied thereto, it is possible to enhance or to tune their operations with biases applied thereto. This is shown schematically as battery 13, potentiometer 14 and switch 15 in FIG. 1a and battery 23, potentiometer 24, and switch 25 in FIG. 1b.

Turning now to FIGS. 2a and 2b, we see what may be considered capacitive meshes, because current flows through their non-continuous structures are primarily displacive across the inter-element capacitance. FIG. 2a shows a regular array of vertical rectangular highly-conductive bars arranged in pairs 30a–30b, with non-linear elements 30c (of length d) connecting 30a and 30b. The spacing between the elements (30a, 30b, 30c) of the array is g (horizontal) and h (vertical) and the bar thickness is t. Each element has length 1 with bar width 2b. The array is carried on transparent substrate 3.

In FIG. 2b, the mesh is in the form of elements similar to those in FIG. 2b, but with both vertical and horizontal orientations. The vertical and horizontal spacings of the vertical elements (40a, 40b, 40c) are the same as in FIG. 2a, and the horizontal elements (41a, 41b, 41c) are centered between vertical elements. The widths and thicknesses of the bars 40a, 40b, 41a, 41b and of the non-linear elements 40c, 41c and the same are corresponding dimensions in FIG. 2a. Like FIG. 1a, FIG. 2a is non-isotropic, and like FIG. 1b, FIG. 2b is isotropic.

In order for an artificial dielectric to avoid diffraction effects, the unit cell dimensions must be on the order of $$\frac{2\lambda}{3n}$$

or less, where $\lambda$ is the wavelength and n is the substrate index of refraction. If this is not the case, the structure will diffract at the Bragg angle just as X-Rays are diffracted by real dielectrics when the radiation wavelength is the same order as the unit cell.

Typical mesh dimensions and materials for an isotropic mesh are listed in Table 1. The unit cell dimension, based on the diffraction limit, assumes the smallest wavelength in the range. The conductor width, a, is selected to be one tenth the unit cell. The mesh thickness, t, should exceed approximately two optical skin depths in order to behave like a metal. The transmitting substrates exhibit the lowest available index of refraction. A high conductivity metal, gold, was chosen for the mesh, a fact which is particularly important in the high frequency range where plasma resonance effects (i.e. plasmons) make the metal lossy, due to an increase in the resistance of the metal which effects a power loss thereacross during the flow of induced currents therein. It should be noted that this plasmon effect, the second high frequency limit encountered by the technology, usually occurs at frequencies higher than the diffraction limit discussed above.

TABLE I

| Wavelengths | 0.5-1 μm | 3-5 μm | 8-12 μm | 1 mm |
|---|---|---|---|---|
| Substrate Material | Glass | CaFl$_2$ | CaFl$_2$ | TPX |
| Substrate Index of Refraction | 1.5 | 1.4 | 1.3 | 1.5 |
| Mesh Metal | Au | Au | Au | Au |
| g = h(μm) | 0.2 | 1.4 | 4.1 | 450 |
| b(μm) | 0.02 | 0.14 | 0.41 | 45 |
| t (Angstroms) | 500 | 1000 | 2000 | 10,000 |

Table 1 clearly shows that the dimensional requirements of this technology constrain its use to three microns or greater if conventional deep UV photo-lithography is used. However, if e-beam lithographic techniques are applied these concepts may be useful in the visible. The most attractive application ranges, in terms of ease of fabrication and the lack of optically active materials, are the 8-12 micron and 1 millimeter ranges.

The non-linear artificial dielectric mesh can be constructed from any number of highly conductive metals, such as gold or silver or metallic low-temperature superconductive conductors. The mesh structure is formed using standard photo-lithographic techniques with particular attention paid to surface smoothness to keep skin losses to a minimum. Reactive sputter etching techniques are quite applicable because of the smooth edge definition they produce. The metal lattice can be placed on any substrate which is transparent to the input wavelength. For example: polymers, quartz, or glasses in the visible/near infrared; germanium, zinc selenide, calcium fluoride, or zinc telluride in the 8-12 micron region; or rexolite, TPX or saphire in the millimeter wave region. In order to keep the wavelength in the substrate as large as possible to permit a larger mesh unit cell, the substrate index of refraction should be minimized.

As yet, in the description of FIGS. 1a, 1b, 2a, and 2b, no mention has been made of exactly what non-linear devices, elements, or materials will be incorporated into these meshes. There are a number of materials and non-linear devices of dimensions (d 2b) that can be embedded in these meshes. In particular, the following examples of embedded non-linear devices are; metal-oxide-metal tunnel diodes (MOMs), Schottky and p-n junction diodes, Gunn diodes, and superlattice structures. Examples of embedded capacitors for reactive tuning are formed using layers of strontium barium niobate, lithium niobate, and lithium tantalate.

For specific device implementation we can look to FIGS. 3 to 7.

Figure 3:
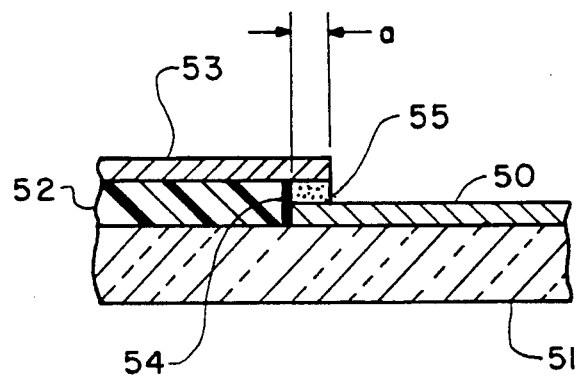
FIG. 3 shows a cross section of an edge metal-oxide-metal (MOM) tunnel diode as incorporated in either inductive or capacitive meshes.

Metal-oxide-metal devices could be incorporated into the mesh structure using the edge-MOM configuration shown in FIG. 3. This device includes electrode 50 atop semi-insulating substrate 51. Also on 51 is insulating layer 52 with electrode 53 atop and overlaping. The actual tunnel junction is formed by an oxide layer 54 approximately 10 A thick. An oxide layer 55 is used to reduce parasitic capacatance because of electrode overlap. Nickel or tungsten electrodes separated by a native oxide are commonly use for such diodes.

Figure 4:
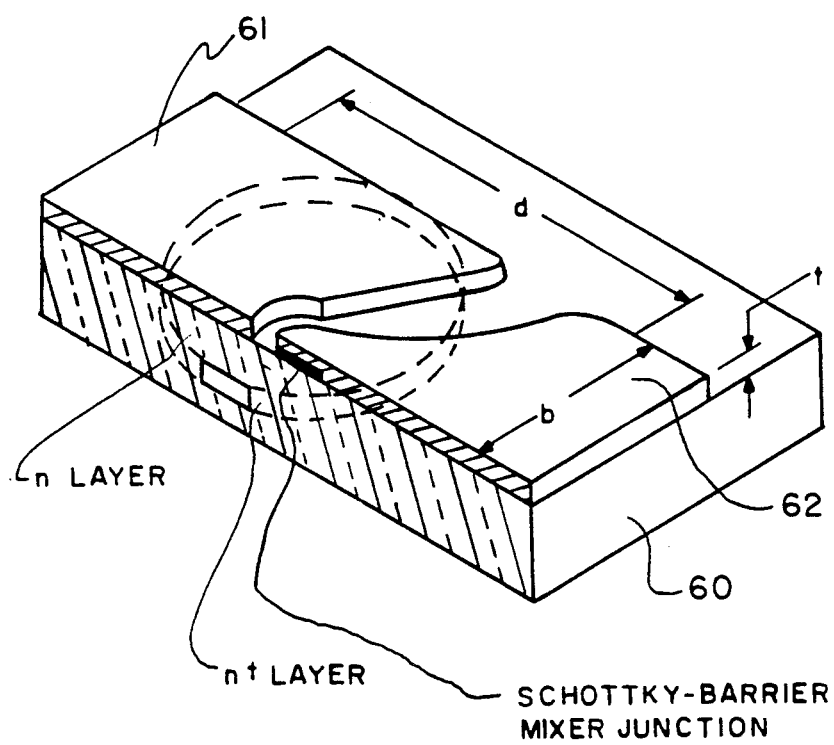
FIG. 4 is an isometric view, partly in section, of a surface oriented Schottky diode which may be incorporated into either or both of the FIG. 1 and 2 meshes.
Figure 5:
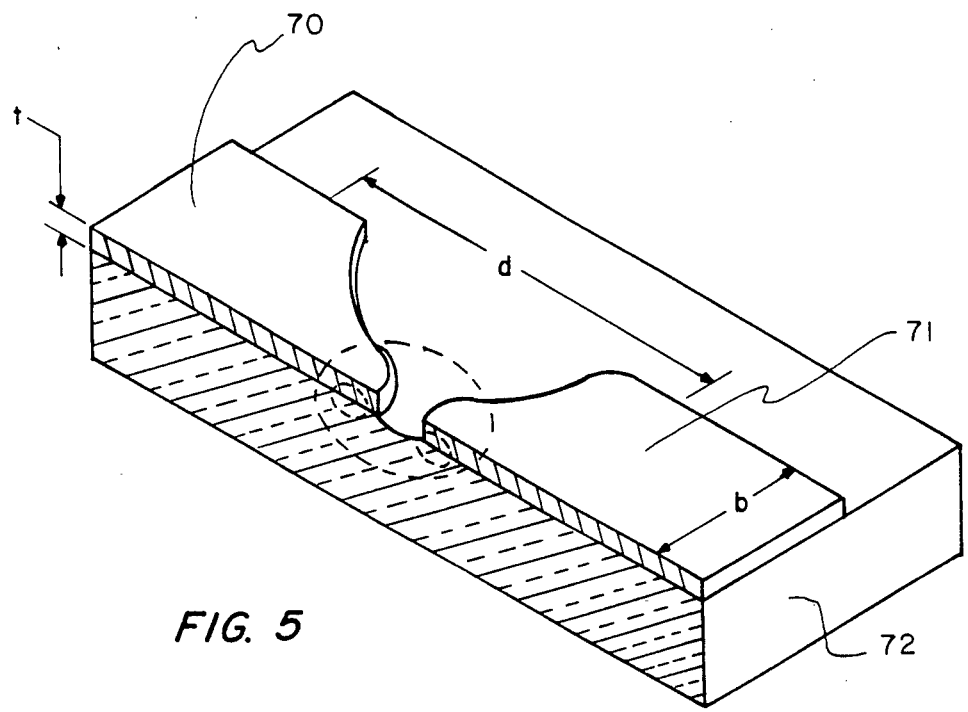
FIG. 5 is an isometric view, partly in section, of a Gunn diode which may be incorporated into either of both of the FIG. 1 and FIG. 2 meshes.

A surface oriented Schottky diode could be incorporated into the structure using the planar configuration shown in FIG. 4. This diode is formed in either a silicon or gallium arsenide substrate 60, with a lead 61 functioning as an ohmic lead, and lead 62 as the Schottky barrier. Both leads lie on the top surface of the substrate, with the actual diode environment formed by a diffusion or implantation process of n and n+ layers. The balance of the substrate would be semi-insulating in order to keep conductive loss to a minimum. A mixer function of about 2 μm diameter is formed.

In some instances, it may be desirable from a processing point of view to form a p-n junction, rather than a Schottky. If this is the case, an additional p diffusion would be required. One lead of the device would then be connected to an ohmic contact in the n region and the other to an ohmic contact in the p region. This structure is not shown because it would be very simlar to FIG. 4. The bulk charge transfer device configuration is similar to the Schottky, except that both leads are connected to the dielectric by ohmic contacts. In the Gunn device shown in FIG. 5, leads 70 and 71 lie atop substrate 72 of InP or GaAs. The non-linearity is created by the transfer of carriers from a high mobility to a low mobility band extremum. This transfer occurs in the bulk when an externally applied optical field exceeds the critical value.

Figure 6:
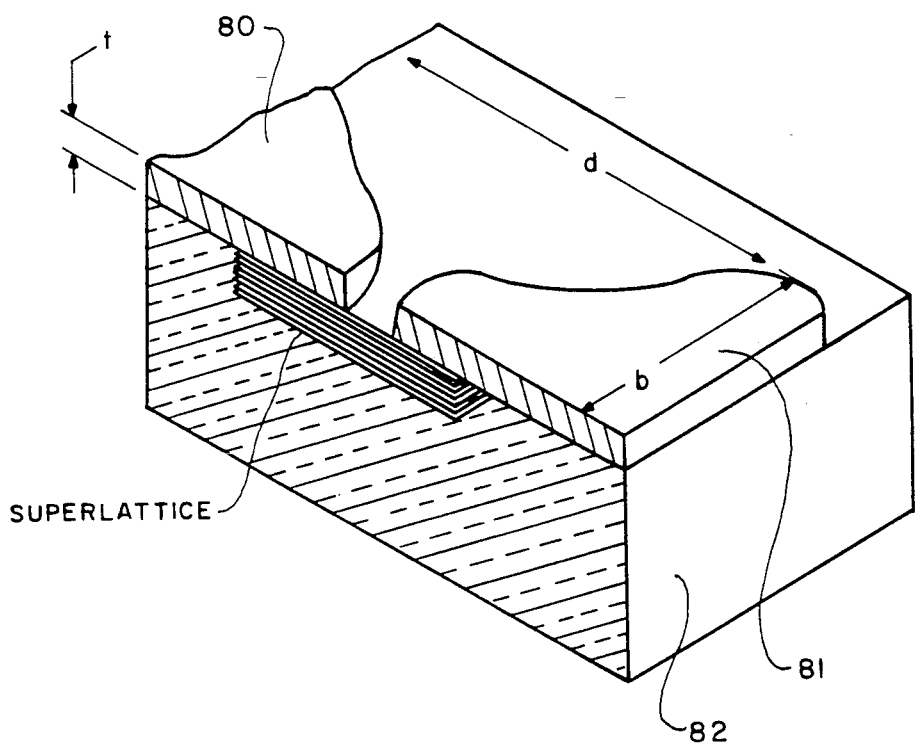
FIG. 6 is an isometric view, partly in section, of a superlattice non-linear structure which may be imbedded in either or both of the FIG. 1 and 2 meshes.

In the superlattice device shown in FIG. 6, we see leads 80 and 81 atop device substrate 82, with the superlattice formed in the bulk of the substrate. The non-linearity is created by the transfer of carriers from high to low conductivity layers. This transfer occurs in the device when the carriers are thermally excited by the externally applied optical field currents. The high and low conductivity layers can be different bandgap materials and/or doping concentrations. GaAs or GaAlAs materials are possible condidates for this device.

Two non-linear capacitor configurations are shown in FIGS. 7a and 7b. In FIG. 7a, lead 90 lies on substrate 91, and lead 92 lies atop and overlaps oxide (insulating) layer 93 carried by the substrate. The leads are separated by a non-linear dielectric 94. The actual value of the non-linear capacitance is controlled by the overlap area, the dielectric thickness, and the dielectric constant. As previously mentioned, materials from which the non-linear dielectric may be chosen include strontiam barium niobate, lithium niobate, and lithium tantalate.

In the FIG. 7b embodiment, the non-linear material 95 is between two non-overlapping leads 96 and 97 on substrate 98. The preferred configuration depends upon the processing method used to deposit the non-linear dielectric.

It should be understood that the devices as shown in FIGS. 3-6 are not novel, and that their fabrication is well known in the art. What is important is how they are used in the present invention.

The back surfaces of the substrate in the preferred embodiments of the invention as shown in FIGS. 1a, 1b, 2a, and 2b should be anti-reflection (AR) coated to facilitate impedance matching to free space for single mesh structures. For more complicated designs, both the front and back surface of the substrate can be covered with the mesh structure, eliminating the need for such an AR coating.

It should be noted that the voltage controllable mesh applications disclosed here differ from those fixed mesh applications, in that the phase, rather than amplitude, is the controlled parameter.

We claim:

1. A non-linear artificial dielectric structure responsive to a change in intensity of input radiation to effect a change in the optical index of refraction therein, comprising:

a planar substrate composed of a material exhibiting an optical transparency characteristic at the optical frequency of the input radiation;

a metal lattice network arranged to have a repeatable pattern incident with the input surface of the planar substrate and fabricated of arrayed conductive unit cells having dimensions on the order of $2\lambda/3n$ or less, where $\lambda$ is the wavelength and n is the substrate index of refraction, which should be the lowest possible, wherein the width of the conductive cell is selected to be in the order of one tenth the unit cell length, and the unit cell thickness should exceed approximately two optical skin depths in order to behave as a metal;

a plurality of non-linear elements incorporated into said metal lattice network by interconnecting various arrayed conductive unit cells in a manner to achieve a non-linear interaction within the resulting artificial dielectric structure effected by the flow of field induced currents therein.

2. The dielectric as set forth in claim 1 wherein said pattern consists of parallel strips in the form of crosses, with horizontal arms of said crosses joined, and wherein said non-linear elements are connected between vertical arms of said crosses.

3. The dielectric as set forth in claim 1 wherein said pattern consists of an array of Greek crosses, equally spaced apart in vertical columns and horizontal rows, and wherein said non-linear elements are connected between both vertical and horizontal arms of said crosses.

4. The dielectric as set forth in claim 1 wherein said pattern consists of parallel vertical columns and horizontal rows of pairs of bars, wherein said non-linear elements are connected between the members of each pair.

5. The dielectric as set forth in claim 4 wherein said pairs of bars all have parallel longitudinal axes.

6. The dielectric as set forth in claim 1 wherein said non-linear elements are metal-oxide-metal tunnel diodes.

7. The dielectric as set forth in claim 1 wherein said non-linear elements are Schottky diodes.

8. The dielectric as set forth in claim 1 wherein said non-linear elements are superlattice structures.

9. The dielectric as set forth in claim 1 wherein said non-linear elements are non-linear capacitors.

10. The dielectric as set forth in claim 2 wherein said non-linear elements are metal-oxide-metal tunnel diodes.

11. The dielectric as set forth in claim 2 wherein said non-linear elements are Schottky diodes.

12. The dielectric as set forth in claim 2 wherein said non-linear elements are superlattice structures.

13. The dielectric as set forth in claim 2 wherein said non-linear elements are non-linear capacitors.

14. The dielectric as set forth in claim 3 wherein said non-linear elements are metal-oxide-metal tunnel diodes.

15. The dielectric as set forth in claim 3 wherein said non-linear elements are Schottky diodes.

16. The dielectric as set forth in claim 3 wherein said non-linear elements are superlattice structures.

17. The dielectric as set forth in claim 3 wherein said non-linear elements are non-linear capacitors.

18. The dielectric as set forth in claim 4 wherein said non-linear elements are metal-oxide-metal tunnel diodes.

19. The dielectric as set forth in claim 4 wherein said non-linear elements are Schottky diodes.

20. The dielectric as set forth in claim 4 wherein said non-linear elements are superlattice structures.

21. The dielectric as set forth in claim 4 wherein said non-linear elements are non-linear capacitors.

22. The dielectric as set forth in claim 5 wherein said non-linear elements are metal-oxide-metal tunnel diodes.

23. The dielectric as set forth in claim 5 wherein said non-linear elements are Schottky diodes.

24. The dielectric as set forth in claim 5 wherein said non-linear elements are superlattice structures.

25. The dielectric as set forth in claim 5 wherein said non-linear elements are non-linear capacitors.

26. The dielectric as set forth in claim 1 wherein an electrical bias means is coupled to the metal lattice network for effecting a tuning of the arrayed conductive cells for enhancing the responsiveness of the artificial dielectric structure.

* * * * *